United States Patent
Yamamoto et al.

(10) Patent No.: US 11,581,444 B2
(45) Date of Patent: Feb. 14, 2023

(54) SOLAR CELL, MULTI-JUNCTION SOLAR CELL, SOLAR CELL MODULE, AND SOLAR PHOTOVOLTAIC POWER GENERATION SYSTEM

(71) Applicants: KABUSHIKI KAISHA TOSHIBA, Tokyo (JP); TOSHIBA ENERGY SYSTEMS & SOLUTIONS CORPORATION, Kawasaki (JP)

(72) Inventors: Kazushige Yamamoto, Yokohama Kanagawa (JP); Soichiro Shibasaki, Nerima Toyko (JP); Mutsuki Yamazaki, Yokohama Kanagawa (JP); Naoyuki Nakagawa, Setagaya Tokyo (JP); Yuya Honishi, Saitama Saitama (JP); Sara Yoshio, Yokohama Kanagawa (JP); Yoshiko Hiraoka, Kawasaki Kanagawa (JP)

(73) Assignees: KABUSHIKI KAISHA TOSHIBA, Tokyo (JP); TOSHIBA ENERGY SYSTEMS & SOLUTIONS CORPORATION, Kawasaki (JP)

( * ) Notice: Subject to any disclaimer, the term of this patent is extended or adjusted under 35 U.S.C. 154(b) by 0 days.

(21) Appl. No.: 17/526,018

(22) Filed: Nov. 15, 2021

(65) Prior Publication Data
US 2022/0077332 A1 Mar. 10, 2022

Related U.S. Application Data

(63) Continuation of application No. PCT/JP2020/011290, filed on Mar. 13, 2020.

(30) Foreign Application Priority Data

Jul. 2, 2019 (JP) .............................. JP2019-123899

(51) Int. Cl.
*H01L 31/0336* (2006.01)
*H01L 31/068* (2012.01)
(Continued)

(52) U.S. Cl.
CPC ........ *H01L 31/0336* (2013.01); *H01L 31/068* (2013.01); *H01L 31/0725* (2013.01); *H01L 31/032* (2013.01)

(58) Field of Classification Search
CPC ............... H01L 31/0336; H01L 31/068; H01L 31/0725; H01L 31/032
See application file for complete search history.

(56) References Cited

U.S. PATENT DOCUMENTS

2007/0000537 A1* 1/2007 Leidholm ......... H01L 31/03928
257/E31.027
2019/0237598 A1* 8/2019 Matsui ................... H01L 31/032
(Continued)

FOREIGN PATENT DOCUMENTS

JP 2005-239526 9/2005
JP 2006-124754 5/2006
(Continued)

OTHER PUBLICATIONS

International Search Report and Written Opinion for International Application No. PCT/JP2020/011290 dated Jun. 9, 2020, 8 pgs.
(Continued)

*Primary Examiner* — Golam Mowla
(74) *Attorney, Agent, or Firm* — Amin, Turocy & Watson, LLP

(57) ABSTRACT

The solar cell of embodiments includes a transparent first electrode, a photoelectric conversion layer mainly containing cuprous oxide on the first electrode, an n-type layer on the photoelectric conversion layer, and a transparent second electrode on the n-type layer. A mixed region or/and a mixed
(Continued)

layer are present on the n-type layer side of the photoelectric conversion layer, and the mixed region and the mixed layer contain elements belonging to a first group, a second group, and a third group. The first group is one or more elements selected from the group consisting of Zn and Sn, the second group is one or more elements selected from the group consisting of Y, Sc, V, Cr, Mn, Fe, Ni, Zr, B, Al, Ga, Nb, Mo, Ti, F, Cl, Br, and I, and the third group is one or more elements selected from the group consisting of Ge and Si.

12 Claims, 4 Drawing Sheets

(51) Int. Cl.
*H01L 31/0725* (2012.01)
*H01L 31/032* (2006.01)

(56) References Cited

U.S. PATENT DOCUMENTS

2020/0091357 A1* 3/2020 Shibasaki ......... H01L 31/02168
2021/0013360 A1 1/2021 Shibasaki et al.

FOREIGN PATENT DOCUMENTS

| JP | 3828029 | 9/2006 |
|---|---|---|
| JP | 2012-186415 | 9/2012 |
| JP | 2017-098479 | 6/2017 |
| JP | 2018-046196 | 3/2018 |
| JP | 2020-145426 | 9/2020 |

OTHER PUBLICATIONS

Minami, et al., "High-efficiency solar cells fabricated using oxide semiconductors", Applied Physics, vol. 86, No. 8 (2017).
Nishi, "A Study of High-Efficiency Heterojunction Solar Cells Using a Cu2O Sheets as p-type Oxide semiconductor Layer", Kenjiro Takayanagi Foundation, Jan. 2017.
Minami, et al., "Cu2O-based solar cells using oxide semiconductors", Journal of Semiconductors, vol. 37, No. 1, 2016.
Minami, et al., "Efficiency enhancement using a Zn1-xGex-O thin film as an n-type window layer in Cu2O-based heterojunction solar cells", Applied Physics Express 9, 052301, 2016.
Kaur, et al., "Localized surface plasmon induced enhancement of electron-hole generation with silver metal island at n-Al:ZnO/p-Cu2O heterojunction", Applied Physics Letters 107, 053901, 2015.
Lee, et al., "Atomic Layer Deposited Gallium Oxide Buffer Layer Enables 1.2 V Open-Circuit Voltage in Cuprous Oxide Solar Cells", Advanced Materials, 2014, 26, pp. 4704-4710.
Cai, et al. "The n-type conduction of indium-doped Cu2O thin films fabricated by direct current magnetron co-sputtering", Applied Physics Letters 107, 083901 (2015).
Shibasaki, et al., "Transparent Cu2O solar cell for high-efficiency and low-cost tandem photovoltaics" Proceedings of 2019 IEEE 46the Photovoltaic Specialists Conference (PVSC), 2019, pp. 1061-1063.

* cited by examiner

SOLAR CELL, MULTI-JUNCTION SOLAR CELL, SOLAR CELL MODULE, AND SOLAR PHOTOVOLTAIC POWER GENERATION SYSTEM

CROSS-REFERENCE TO RELATED APPLICATIONS

This application is a Continuation application of PCT International Application PCT/JP2020/011290, the International Filing Date of which is Mar. 13, 2020, which is based upon and claims the benefit of priority from Japanese Application 2019-123899, the filling Date of which is Jul. 2, 2019, and the entire contents of both of which are incorporated herein by reference.

FIELD

Embodiments described herein relate generally to a solar cell, a multi-junction solar cell, a solar cell module, and a solar photovoltaic power generation system.

BACKGROUND

There are multi-junction (tandem) solar cells as highly efficient solar cells. Tandem solar cells can achieve a higher efficiency than single-junction solar cells since a cell having a high spectral sensitivity can be used for every wavelength band. Moreover, as a top cell of tandem solar cells, a cuprous oxide compound which is an inexpensive material and has a wide band gap, and the like are expected.

DETAILED DESCRIPTION

The solar cell of embodiments includes a transparent first electrode, a photoelectric conversion layer mainly containing cuprous oxide on the first electrode, an n-type layer on the photoelectric conversion layer, and a transparent second electrode on the n-type layer. A mixed region or/and a mixed layer are present on the n-type layer side of the photoelectric conversion layer, and the mixed region and the mixed layer contain elements belonging to a first group, a second group, and a third group. The first group is one or more elements selected from the group consisting of Zn and Sn, the second group is one or more elements selected from the group consisting of Y, Sc, V, Cr, Mn, Fe, Ni, Zr, B, Al, Ga, Nb, Mo, Ti, F, Cl, Br, and I, and the third group is one or more elements selected from the group consisting of Ge and Si.

Figure 1:
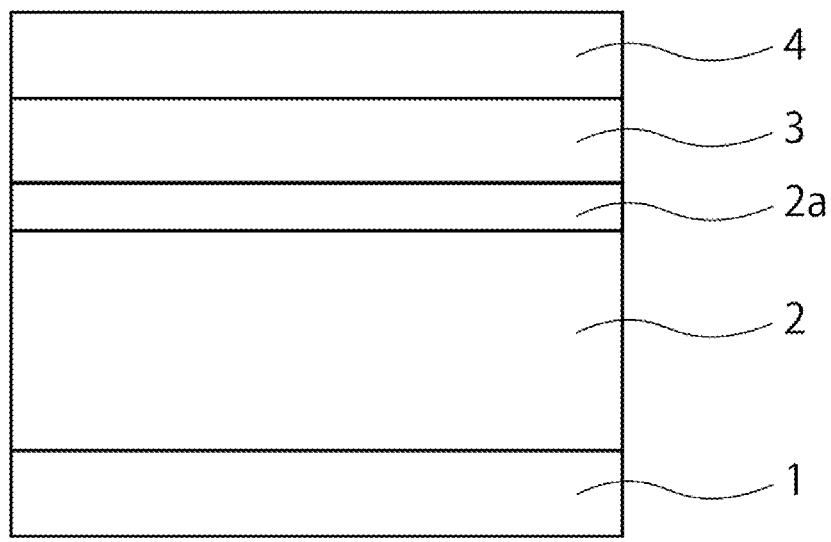
FIG. 1 illustrates a conceptual sectional diagram of a solar cell according to an embodiment.

A first embodiment relates to a solar cell. FIG. 1 illustrates a conceptual diagram of a solar cell 100 according to the first embodiment. As illustrated in FIG. 1, the solar cell 100 according to the present embodiment includes a first electrode 1, a photoelectric conversion layer 2 on the first electrode 1, an n-type layer 3 on the photoelectric conversion layer 2, and a second electrode 4 on the n-type layer 3. An intermediate layer (not illustrated) may be included between the first electrode 1 and the photoelectric conversion layer 2 and between the n-type layer 3 and the second electrode 4. Light may be incident from the first electrode 1 side or from the second electrode 4 side. Electric power can be generated as light enters the solar cell 100.

(First Electrode)

The first electrode 1 of the embodiment is a transparent conductive layer provided on the photoelectric conversion layer 2 side. In FIG. 1, the first electrode 1 is in direct contact with the photoelectric conversion layer 2. The first electrode 1 is preferably a transparent conductive film or a laminate of a transparent conductive film and a metal film. The transparent conductive film is not particularly limited and is indium tin oxide (ITO), aluminum-doped zinc oxide (Al-doped Zinc Oxide; AZO), boron-doped zinc oxide (BZO), gallium-doped zinc oxide (GZO), fluorine-doped tin oxide (FTO), antimony-doped tin oxide (ATO), titanium-doped indium oxide (ITiO), indium zinc oxide (IZO) and indium gallium zinc oxide (IGZO), tantalum-doped tin oxide (Ta-doped Tin Oxide; $SnO_2$:Ta), niobium-doped tin oxide (Nb-doped Tin Oxide; $SnO_2$:Nb), tungsten-doped tin oxide (W-doped Tin Oxide; $SnO_2$:W), molybdenum-doped tin oxide (Mo-doped Tin Oxide; $SnO_2$:Mo), fluorine-doped tin oxide (F-doped Tin Oxide; $SnO_2$:F), hydrogen-doped indium oxide (IOH), and the like. The transparent conductive film may be a laminated film having a plurality of films, and films of tin oxide and the like may be included in the laminated film in addition to the oxides. The dopant for the films of tin oxide and the like is not particularly limited and is In, Si, Ge, Ti, Cu, Sb, Nb, F, Ta, W, Mo, F, Cl, and the like. The metal film is not particularly limited and is films of Mo, Au, Cu, Ag, Al, Ta, W, and the like. Moreover, the first electrode 1 may be an electrode in which a dot-shaped, line-shaped or mesh-shaped metal is provided under the transparent conductive film. At this time, the dot-shaped, line-shaped or mesh-shaped metal is disposed on the side of the transparent conductive film opposite to the photoelectric conversion layer 2. The dot-shaped, line-shaped or mesh-shaped metal preferably has an aperture ratio of 50% or more with respect to the transparent conductive film. The dot-shaped, line-shaped or mesh-shaped metal is not particularly limited and is Mo, Au, Cu, Ag, Al, Ta, W, and the like. In the case of using a metal film in the first electrode 1, the film thickness is preferably set to about 5 nm or less from the viewpoint of transparency.

(Photoelectric Conversion Layer)

The photoelectric conversion layer 2 of the embodiment is a semiconductor layer disposed between the first electrode 1 and the n-type layer 3. The photoelectric conversion layer 2 is preferably a compound semiconductor layer. Examples of the photoelectric conversion layer 2 include a semiconductor layer mainly (90 wt % or more) containing cuprous oxide. The transmittance is lower as the photoelectric conversion layer 2 is thicker, a thickness of 10 micro meter or less is practical when film formation by sputtering is taken into consideration, and a semiconductor layer mainly containing cuprous oxide is preferable as the compound semiconductor layer. The thickness of the photoelectric conversion layer 2 is preferably 800 nm or more and 10 micro meter or less. Additives may be contained in a semiconductor layer mainly containing cuprous oxide or the like as the compound semiconductor layer.

Figure 2:
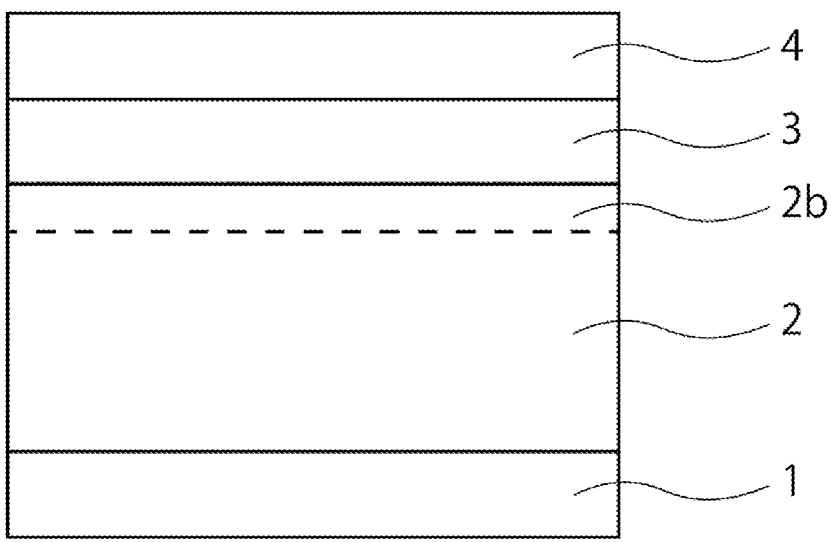
FIG. 2 illustrates a conceptual sectional diagram of a solar cell according to an embodiment.

It is preferable that an element belonging to the first group, an element belonging to the second group, and an element belonging to the third group are contained in the region (mixed region) on the n-type layer 3 side of the photoelectric conversion layer 2 or the layer (mixed layer) on the n-type layer 3 side of the photoelectric conversion layer 2. The conceptual diagram in FIG. 1 illustrates a form in which a mixed region 2a is present on the n-type layer 3 side of the photoelectric conversion layer 2. The conceptual diagram in FIG. 2 illustrates a form in which a mixed layer 2b is present on the n-type layer 3 side of the photoelectric conversion layer 2. The photoelectric conversion layer 2 is a semiconductor layer including the mixed region 2a and/or the mixed layer 2b.

The element belonging to the first group is preferably one or more elements selected from the group consisting of Zn and Sn. The element belonging to the first group is also contained in the n-type layer 3.

The element belonging to the second group is preferably one or more elements selected from the group consisting of Y, Sc, V, Cr, Mn, Fe, Ni, Zr, B, Al, Ga, Nb, Mo, Ti, F, Cl, Br, and I.

The element belonging to the third group is preferably one or more elements selected from the group consisting of Ge and Si. Furthermore, the element belonging to the third group is also contained in the n-type layer 3.

The element belonging to the first group is considered to have a function of increasing the resistance in the region present in the photoelectric conversion layer 2. The element belonging to the second group is also considered to have a function of increasing the resistance in the region present in the photoelectric conversion layer 2 similarly to the element belonging to the first group.

In contrast, the element belonging to the third group is considered to have a function of decreasing the resistance in the region present in the photoelectric conversion layer 2.

Voc and FF (fill factor) are improved as three kinds of elements of the element belonging to the first group, the element belonging to the second group, and the element belonging to the third group are contained. Voc and FF are not improved or are hardly improved when the element belonging to one of the three groups is not contained. For this reason, it is important that three kinds of elements of the element belonging to the first group, the element belonging to the second group, and the element belonging to the third group are contained in the mixed region and the mixed layer.

The reason why Voc and FF are improved in a case where the elements which belong to the respective groups and are considered to have such a function are contained in the mixed region 2a and the mixed layer 2b can be inferred as follows.

When the resistance of the mixed region 2a and the mixed layer 2b increases and the resistance value reaches a proper range, Voc and FF are improved as this advantageously acts on the generation of photogenerated carriers (electrons and holes) in the pn junction region.

However, it can be inferred that the recombination of photogenerated carriers in the pn junction region increases and Voc and FF decrease when the resistance of the mixed region 2a and the mixed layer 2b is out of the proper range and is increased or is decreased on the contrary. For this reason, it can be inferred that Voc and FF can be improved as the elements belonging to the first group, the second group, and the third group are present in the mixed region 2a and the mixed layer 2b since the resistance values of the mixed region 2a and the mixed layer 2b can be maintained at proper values.

In a case where a part of the elements which belong to the first group and the third group and constitute the n-type layer 3 are diffused into the mixed region 2a and the mixed layer 2b to change the composition of the n-type layer 3, the concentrations of the elements belonging to the first group and the third group in the mixed region 2a and the mixed layer 2b change. As the concentrations of the elements belonging to the first group and third group in the mixed region 2a and the mixed layer 2b change in this manner, in order to further improve Voc and FF, Voc and FF are improved when a concentration a and a concentration c satisfy $c<a$ and it is more preferable that the concentration a and the concentration c satisfy $c<a<100c$ for improvement in Voc and FF, where the concentration a denotes the average concentration of the elements belonging to the first group in the mixed region 2a and the mixed layer 2b and the concentration c denotes the average concentration of the elements belonging to the third group).

Here, the elements belonging to the first group and third group are all constituent elements of the n-type layer, and thus Voc and FF decrease in a case where the concentration of the element belonging to the third group in the n-type layer is higher than the concentration of the element belonging to the first group, namely, in a case where the concentration a and concentration c in the mixed region 2a and the mixed layer 2b satisfy $c>a$ in order to improve the energy matching of the conduction band between the n-type layer and the photoelectric conversion layer.

Hence, when a new element belonging to the second group is present in the mixed region 2a and the mixed layer 2b, Voc and FF can be improved as $a+b>c$ is satisfied even if $a<c$, where a concentration b denotes the average concentration of the elements belonging to the second group in the mixed region 2a and the mixed layer 2b in a case where the elements belonging to the first, second and third groups are simultaneously contained. Furthermore, it is more preferable that $c<a+b<100c$ is satisfied.

Furthermore, the average concentrations of the elements which belong to the first group and second group and are contained in the photoelectric conversion layer 2 (excluding the mixed region 2a and the mixed layer 2b) on the first electrode side are preferably lower than the concentrations a and b. Voc and FF are further improved as the concentrations are in such a relation. This is because the photoelectric conversion layer 2 changes in a direction in which the photoelectric conversion layer 2 entirely becomes an insulator when the resistance of the photoelectric conversion layer on the first electrode 1 side increases to exceed a proper range. For this reason, it is inferred that the photogenerated carriers are likely to recombine.

The thickness of the mixed region 2a is preferably 1 nm or more and 20 nm or less and more preferably 1 nm or more and 10 nm or less. It is possible to confirm the presence of the mixed region 2a and to determine the kinds and concentrations of the elements which belong to the first to third groups and are contained in the mixed region 2a by observing the vicinity of the interface between the photoelectric conversion layer 2 and the n-type layer 3 at a magnification of two million-fold under a transmission electron microscope (TEM), performing the elemental analysis of the photoelectric conversion layer 2 side including the interface between the photoelectric conversion layer 2 and the n-type layer 3 by energy dispersive X-ray spectroscopy (EDX) to confirm $Cu_2O$ and the elements belonging to the first to third groups.

The mixed region 2a is formed by either or both of the addition of the elements belonging to the first to third groups when the surface portion of the photoelectric conversion layer 2 is formed during the film formation of the photoelectric conversion layer 2 and diffusion of elements from the n-type layer 3. The elements belonging to the first to third groups are all included in at least either of the elements to be added or the elements to be diffused from the n-type layer 3.

In a case where the elements belonging to the first to third groups are added to the n-type layer 3 side of the photoelectric conversion layer 2 and the elements are diffused from the n-type layer 3, the elements belonging to the first group are included in at least either of the elements to be added or the elements to be diffused from the n-type layer 3, the elements belonging to the second group are included in at least either of the elements to be added or the elements to be diffused from the n-type layer 3, and the elements belonging to the third group are included in at least either of the elements to be added or the elements to be diffused from the n-type layer 3. In a case where the elements belonging to the first to third groups are added to the n-type layer 3 side of the photoelectric conversion layer 2 and elements are diffused from the n-type layer 3, the elements belonging to the first group are preferably included in the elements to be diffused from the n-type layer 3, the elements belonging to the second group are preferably included in the elements to be added, and the elements belonging to the third group are preferably included in the elements to be diffused from the n-type layer 3.

The thickness of the mixed layer 2b is preferably 1 nm or more and 20 nm or less and more preferably 1 nm or more and 10 nm or less. It is possible to confirm the presence of the mixed layer 2b and to determine the kinds and concentrations of the elements which belong to the first to third groups and are contained in the mixed layer 2b by observing the vicinity of the interface between the photoelectric conversion layer 2 and the n-type layer 3 at a magnification of two million-fold under TEM, confirming the presence of a thin layer on the n-type layer 3 side of the photoelectric conversion layer 2, performing the elemental analysis of the thin layer by EDX to confirm $Cu_2O$ and the elements belonging to the first to third groups.

The mixed layer 2b is formed by once forming the photoelectric conversion layer 2 under a condition of not containing the elements belonging to the first to third groups and then forming a thin film of cuprous oxide again so that the three kinds of elements belonging to the first to third groups are added when the photoelectric conversion layer 2 is formed.

Both the mixed layer 2b and the mixed region 2a may be present. At this time, it is preferable that the mixed region 2a and the mixed layer 2b are in direct contact with each other, the mixed layer 2b is located on the n-type layer 3 side, and the mixed region 2a is located on the first electrode 1 side.

Figure 3:
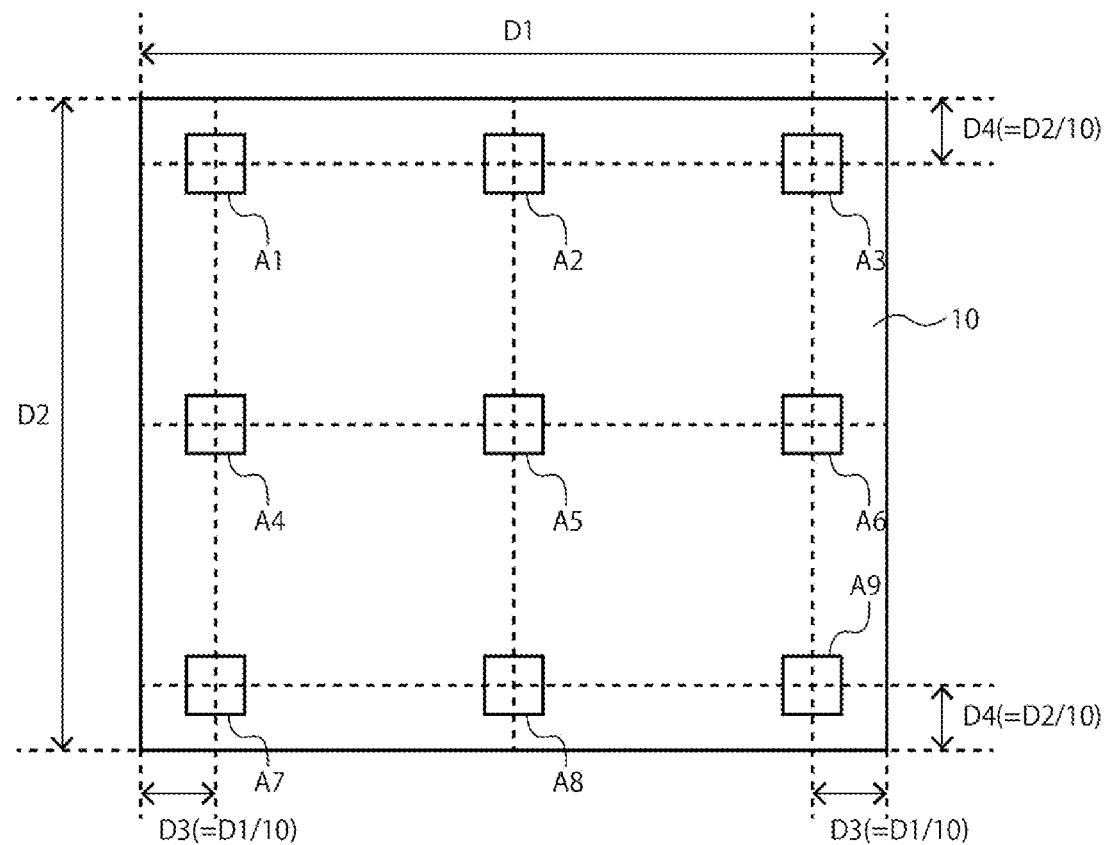
FIG. 3 is illustrates a diagram for explaining an analysis spot of a solar cell of an embodiment.

The concentration is determined by measuring the next analysis spots. As illustrated in the diagram of FIG. 3 for explaining the analysis spots, nine spots A1 to A9 on the surface viewed from the second electrode 4 side of the solar cell 100 are determined. Each spot is square and has an area of at least 5 mm$^2$. Then, as illustrated in FIG. 3, in a case where the length D1 and the width D2 satisfy (D1≥D2), a virtual line is drawn at a distance of D3 (=D1/10) on the inside from each of two sides facing the width direction of the solar cell 100, a virtual line is drawn at a distance of D4 (=D2/10) on the inside from each of two sides facing the length direction of the solar cell 100, furthermore, a virtual line parallel to the width direction passing through the center of the solar cell 100 is drawn, a virtual line parallel to the length direction passing through the center of the solar cell 100 is drawn, and the regions around the nine intersections of the virtual lines are taken as observation spots A1 to A9. The cross section observed under SEM and TEM is in a direction perpendicular to the plane of FIG. 3. Incidentally, in a case where the shape of the solar cell 100 viewed from the second electrode 4 side is not rectangular, it is preferable to determine the analysis spot based on the inscribed rectangle. The concentration is the average value of the analysis results at seven spots excluding two spots having the maximum and minimum values among the nine analysis spots.

In a case where elements belonging to one group or elements belonging to two groups among the elements belonging to the first to third groups are contained on the n-type layer 3 side of the photoelectric conversion layer 2, the improvement in FF and Voc is slight and the effect by the addition of elements does not substantially contribute to the improvement in conversion efficiency. In a case where three kinds of elements of the element belonging to the first group, the element belonging to the second group, and the element belonging to the third group are added, FF and Voc are improved and the conversion efficiency is improved. As three kinds of elements of the elements belonging to the first to third groups are contained on the n-type layer 3 side of the photoelectric conversion layer 2, Voc is improved and the I-V characteristics of the solar cell 100 approach ideal characteristics.

The photoelectric conversion layer 2 is fabricated by sputtering. The atmosphere during sputtering is preferably a mixed gas atmosphere of an inert gas such as Ar and oxygen gas. It also depends on the kind of the substrate holding the solar cell 100, but the substrate temperature is raised to 100° C. or more and 600° C. or less through heating and sputtering is performed using a target containing Cu. For example, a cuprous oxide thin film having a large grain diameter can be formed on the first electrode 1 by adjusting the temperature and oxygen partial pressure in sputtering. As the substrate to be used in the fabrication of the solar cell 100 (substrate holding the first electrode 1), organic substrates such as acrylic, polyimide, polycarbonate, polyethylene terephthalate (PET), polypropylene (PP), fluorine-based resins (polytetrafluoroethylene (PTFE), perfluoroethylene propene copolymer (FEP), ethylene tetrafluoroethylene copolymer (ETFE), polychlorotrifluoroethylene (PCTFE), perfluoroalkoxy alkane (PFA), and the like), polyarylate, polysulfone, polyethersulfone, and polyetherimide and inorganic substrates such as soda lime glass, white glass, chemically strengthened glass, and quartz can be used.

It is preferable that 95% or more of the photoelectric conversion layer 2 is formed of cuprous oxide. It is more preferable that 98% or more of the photoelectric conversion layer 2 is formed of cuprous oxide. In other words, it is preferable that the photoelectric conversion layer 2 hardly (does not substantially) contains heterogenous phases of CuO, Cu and the like. It is preferable that the photoelectric conversion layer 2 does not contain heterogenous phases of CuO, Cu and the like and is substantially a thin film of a single phase of $Cu_2O$ since extremely high translucency is exhibited. The fact that the photoelectric conversion layer 2 is substantially a single phase of $Cu_2O$ can be confirmed through measurement by a photo luminescence method (PL method).

(n-Type Layer)

The n-type layer 3 is an n-type semiconductor layer disposed between the photoelectric conversion layer 2 and the second electrode 4. The surface of the n-type layer 3 facing the photoelectric conversion layer 2 is preferably in direct contact with the surface of the photoelectric conversion layer 2 facing the n-type layer 3. It is preferable that the n-type layer 3 is a metal oxide layer selected from Zn or/and Sn and contains Si or/and Ge. In other words, the metal oxide layer, a metal oxide layer (n-type layer 3) containing at least either of Zn or Zn and at least either of Si or Ge is more preferably a metal oxide layer further containing one or more elements selected from the group consisting of Ga, Al, and B in addition to Zn, Sn, Ge, and Si in consideration of the energy matching of the conduction band between the photoelectric conversion layer 2 and the n-type layer 3. Incidentally, elements other than those described above may be added to the n-type layer 3 in further consideration of the energy matching of the conduction band between the photoelectric conversion layer 2 and the n-type layer 3.

The film thickness of the n-type layer 3 is typically 3 nm or more and 100 nm or less. When the thickness of the n-type layer 3 is less than 3 nm, a leak current is generated in a case where the coverage of the n-type layer 3 is poor and the characteristics are deteriorated in some cases. The film thickness is not limited to the above range in a case where the coverage is favorable. When the thickness of the n-type layer 3 exceeds 50 nm, deterioration in the characteristics due to an excessive increase in resistance of the n-type layer 3 and a decrease in short-circuit current due to a decrease in transmittance occur in some cases. Hence, the thickness of the n-type layer 3 is more preferably 3 nm or more and 20 nm or less and still more preferably 5 nm or more and 20 nm or less.

The n-type layer 3 can be formed by, for example, an atomic layer deposition (ALD) method and a sputtering method.

A conduction band offset ($\Delta E = Ecp - Ecn$), which is a difference between the position ($Ecp$ (eV)) of the conduction band minimum (CBM) of the photoelectric conversion layer 2 and the position ($Ecn$ (eV)) of the conduction band minimum of the n-type layer 3 is preferably −0.6 eV or more and 0.2 eV or less ($-0.6 \text{ eV} \leq \Delta E \leq +0.2 \text{ eV}$). When the conduction band offset is larger than 0, the conduction band at the pn junction interface is discontinuous and spikes are generated. When the conduction band offset is smaller than 0, the conduction band at the pn junction interface is discontinuous and cliffs are generated. Spikes are an energy barrier when photogenerated electrons are taken out from the second electrode, cliffs decrease the voltage of the photogenerated electrons to be taken out, and it is thus preferable that the absolute values of these are both small. Hence, the conduction band offset is more preferably −0.4 eV or more and 0.0 eV or less ($-0.4 \text{ eV} \leq \Delta E \leq 0.0 \text{ eV}$). However, this does not apply to a case where conduction is performed utilizing the level in the gap. The position of CBM can be estimated using the following method. The valence band maximum (VBM) is actually measured by photoelectron spectroscopy, which is a method for evaluating the electron-occupied level, and then CBM is calculated assuming the band gap of the material to be measured. However, an ideal interface is not maintained at the actual pn junction interface because of interdiffusion, generation of cation vacancies, and the like, and there is thus a high possibility that the band gap changes. For this reason, it is preferable that CBM is also evaluated by inverse photoemission spectroscopy directly utilizing the reversal process of photoelectron emission. Specifically, the electronic state at the pn junction interface can be evaluated by repeatedly subjecting the solar cell surface to the low-energy ion etching and photoelectron spectroscopy/inverse photoemission spectroscopy measurement. The elements which belong to the first to third groups and are contained in the mixed region and/or the mixed layer are appropriately selected in consideration of a difference in CBM from the n-type layer 3.

(Second Electrode)

The second electrode 4 of the embodiment is a transparent conductive layer provided on the n-layer. As the second electrode 4, it is preferable to use a transparent electrode similar to the electrode described in the first electrode 1. The second electrode 4 may be an electrode in which a dot-shaped, line-shaped, or mesh-shaped metal is provided on a transparent conductive film. The dot-shaped, line-shaped or mesh-shaped metal preferably has an aperture ratio of 50% or more with respect to the transparent conductive film. The dot-shaped, line-shaped or mesh-shaped metal is not particularly limited and is Mo, Au, Cu, Ag, Al, Ta, W, and the like. In the case of using a metal film in the second electrode 4, the film thickness is preferably set to about 5 nm or less from the viewpoint of transparency. As the second electrode 4, it is preferable to use a transparent electrode similar to the electrode described in the first electrode 1. As the second electrode 4, another transparent electrode such as multilayer graphene provided with a take-out electrode including a metal wire can also be adopted.

(Antireflective Film)

It is preferable that an antireflective film of the embodiment is a film for easily introducing light into the photoelectric conversion layer 2 and is formed on the first electrode 1 or on the side of the second electrode 4 opposite to the photoelectric conversion layer 2 side. It is desirable to use, for example, $MgF_2$ and $SiO_2$ as the antireflective film. Incidentally, in the embodiment, the antireflective film can be omitted. It is necessary to adjust the film thickness depending on the refractive index of each layer, but it is preferable to deposit a thin film having a thickness of about 70 to 130 nm (preferably, 80 to 120 nm).

Second Embodiment

Figure 4:
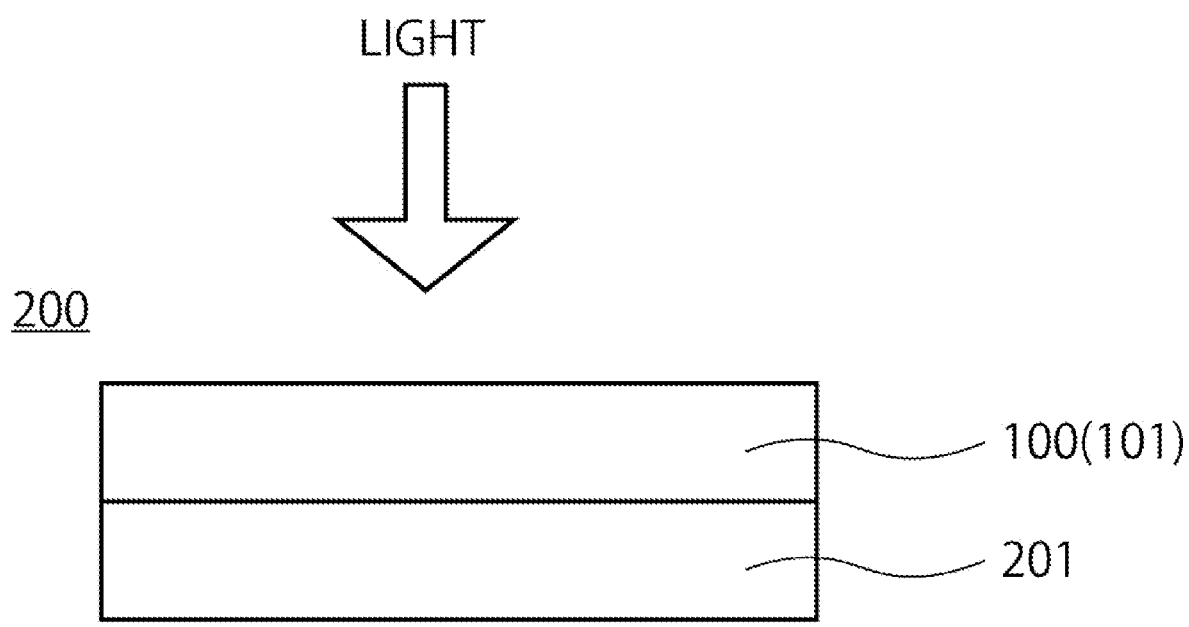
FIG. 4 illustrates a conceptual sectional diagram of a multi-junction solar cell of an embodiment.

A second embodiment relates to a multi-junction solar cell. FIG. 4 illustrates a conceptual sectional diagram of a multi-junction solar cell 200 according to the second embodiment. The multi-junction solar cell 200 of FIG. 4 includes the solar cell (first solar cell) 100 of the first embodiment on the light incident side and a second solar cell 201. The band gap of the photoelectric conversion layer of the second solar cell 201 is smaller than the band gap of the photoelectric conversion layer 2 of the solar cell 100 according to the first embodiment. Incidentally, the multi-junction solar cell according to the embodiment includes a solar cell in which three or more solar cells are joined.

The band gap of the photoelectric conversion layer 2 of the solar cell 100 according to the first embodiment is about 2.0 eV, and thus the band gap of the photoelectric conversion layer of the second solar cell 201 is preferably 1.0 eV or more and 1.4 eV or less. The photoelectric conversion layer of the second solar cell 201 is preferably any one or more compound semiconductor layers among CIGS-based, CIT-based and CdTe-based, and copper oxide-based compound semiconductor layers having a high In content or crystalline silicon.

By adopting the solar cell 100 according to the first embodiment as the first solar cell, it is possible to prevent a decrease in conversion efficiency of the bottom cell (second solar cell) due to the absorption of light in an unintended wavelength region in the first solar cell, and a multi-junction solar cell having a favorable efficiency can be thus obtained.

Third Embodiment

Figure 5:
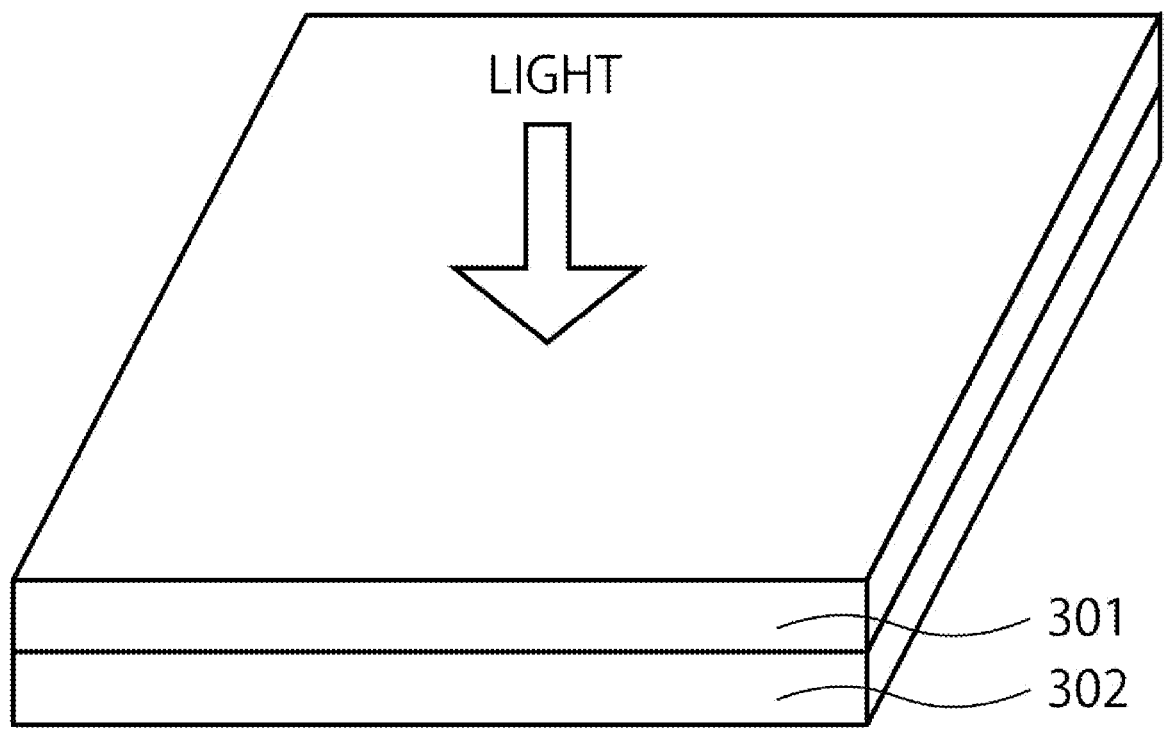
FIG. 5 illustrates a conceptual diagram of a solar cell module of an embodiment.

A third embodiment relates to a solar cell module. FIG. 5 illustrates a conceptual perspective diagram of a solar cell module 300 according to the third embodiment. The solar cell module 300 in FIG. 5 is a solar cell module in which a first solar cell module 301 and a second solar cell module 302 are stacked one on the other. The first solar cell module 301 is on the light incident side and includes the solar cell 100 according to the first embodiment. It is preferable to use the second solar cell 201 in the second solar cell module 302.

Figure 6:
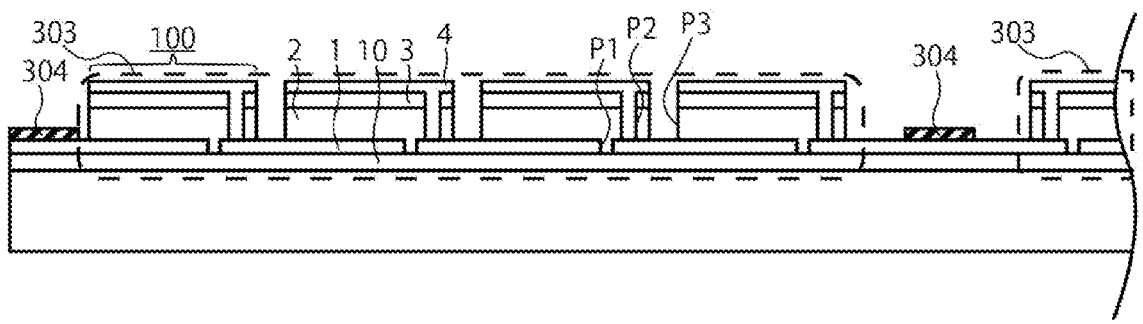
FIG. 6 illustrates a conceptual sectional diagram of a solar cell module of an embodiment.

FIG. 6 illustrates a conceptual sectional diagram of the solar cell module 300. In FIG. 6, the structure of the first solar cell module 301 is illustrated in detail but the structure of the second solar cell module 302 is not illustrated. In the second solar cell module 302, the structure of the solar cell module is appropriately selected depending on the photoelectric conversion layer of the solar cell to be used. In the solar cell module in FIG. 6, a plurality of sub-modules 303 in which a plurality of solar cells 100 are arranged in the horizontal direction and electrically connected to each other in series and which is enclosed by a broken line are included and the plurality of sub-modules 303 are electrically connected to each other in parallel or in series.

The solar cell 100 is scribed, and the second electrode 4 on the upper side is connected to the first electrode 1 on the lower side in between the adjacent solar cells 100. The solar cell 100 according to the third embodiment also includes a substrate 10, a first electrode 1, a photoelectric conversion layer 2, an n-type layer 3, and a second electrode 4 similarly to the solar cell 100 according to the first embodiment.

When the output voltage is different for every module, there is a case where the current flows backward to a low voltage portion or extra heat is generated, and thus this leads to a decrease in the output of the module.

In addition, it is desirable to use the solar cell of the present application since it is possible to use a solar cell suitable for each wavelength band, thus to generate electric power more efficiently than when a top cell and bottom cell solar cell is used singly, and to increase the overall output of the module.

When the conversion efficiency of the entire module is high, the proportion of energy to be heat in the emitted light energy can be decreased. For this reason, a decrease in the efficiency due to a rise in the temperature of the entire module can be suppressed.

Fourth Embodiment

Figure 7:
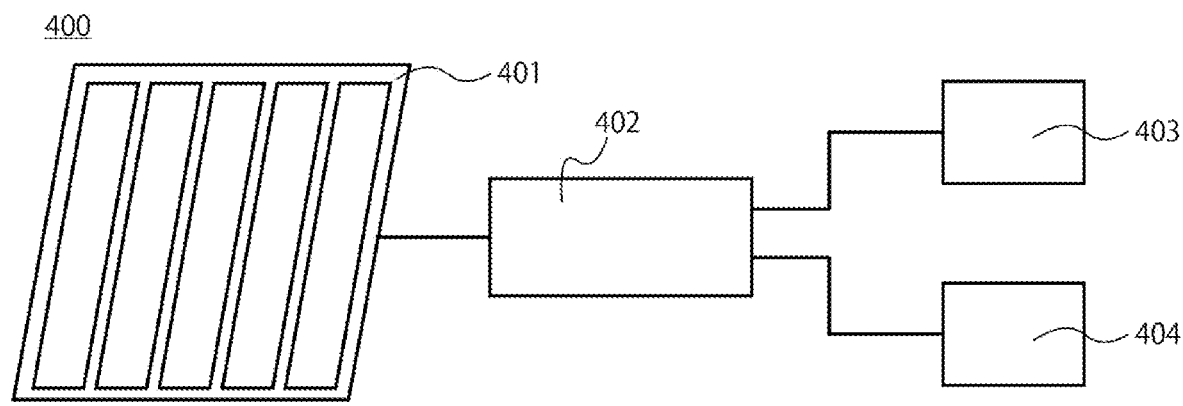
FIG. 7 illustrates a conceptual diagram of a solar photovoltaic power generation system according to an embodiment.

A fourth embodiment relates to a solar photovoltaic power generation system. The solar cell module 300 according to the third embodiment can be used as a generator which generates electric power in the solar photovoltaic power generation system according to the fourth embodiment. The solar photovoltaic power generation system according to the embodiment generates electric power using a solar cell module and specifically includes a solar cell module which generates electric power, a unit which converts the generated electricity into electric power, and a power storage unit which stores the generated electricity or a load which consumes the generated electricity. FIG. 7 illustrates a conceptual configuration diagram of a solar photovoltaic power generation system 400 according to the embodiment. The solar photovoltaic power generation system in FIG. 7 includes a solar cell module 401 (300), a power converter 402, a storage battery 403, and a load 404. Either of the storage battery 403 or the load 404 may be omitted. The load 404 may be configured to be able to utilize the electric energy stored in the storage battery 403. The power converter 402 is an apparatus including a circuit or a device which performs power conversion such as voltage transformation or DC-AC conversion. As the configuration of the power converter 402, a suitable configuration may be adopted depending on the configuration of the generated voltage, the storage battery 403, and the load 404.

The solar cells included in the sub-module 301 which has received light and is included in the solar cell module 300 generate electric power, and the electric energy is converted by the converter 402 and stored in the storage battery 403 or consumed by the load 404. It is preferable to provide the solar cell module 401 with a sunlight tracking and driving apparatus for constantly directing the solar cell module 401 toward the sun or a light collector which collects sunlight or to add an apparatus or the like for improving the power generation efficiency.

It is preferable that the solar photovoltaic power generation system 400 is used for immovable property such as dwellings, commercial facilities, and factories or for movable property such as vehicles, aircraft, and electronic devices. The electric power generation amount is expected to increase as the solar cell having an excellent conversion efficiency according to the embodiment is used in the solar cell module 401.

Figure 8:
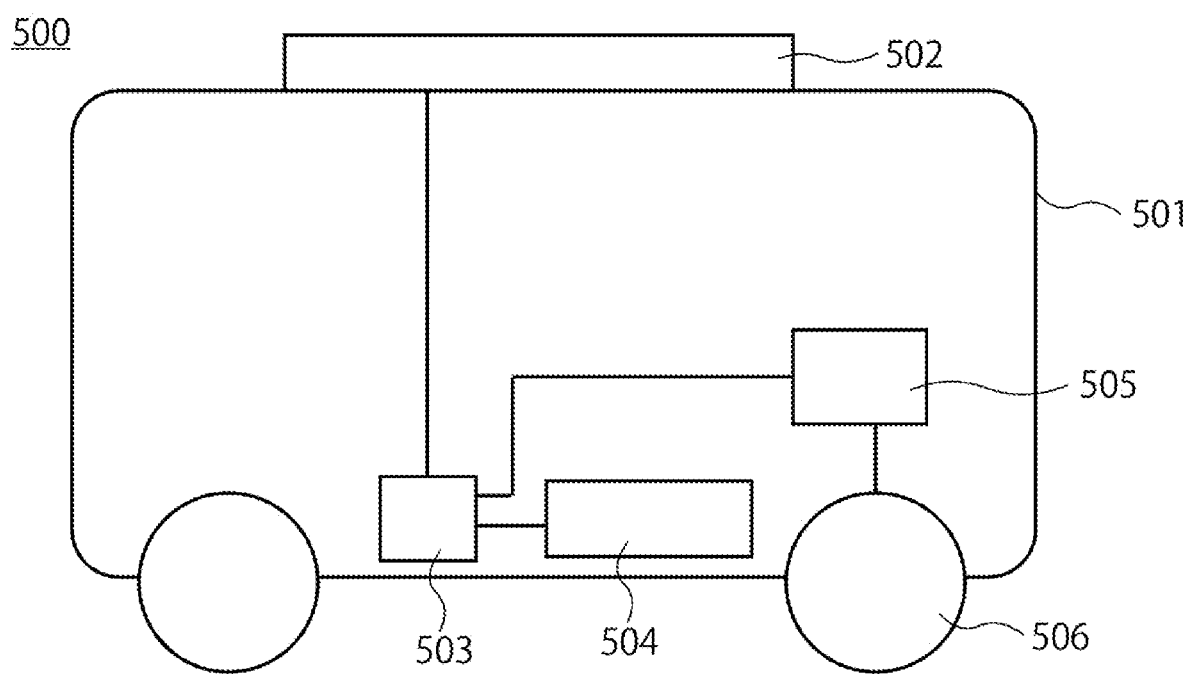
FIG. 8 illustrates a conceptual diagram of a vehicle according to an embodiment.

A vehicle is described as an example of utilization of the solar photovoltaic power generation system 400. FIG. 8 illustrates a conceptual configuration diagram of a vehicle 500. The vehicle 500 in FIG. 8 includes a vehicle body 501, a solar cell module 502, a power converter 503, a storage battery 504, a motor 505, and tires (wheels) 506. The electric power generated by the solar cell module 502 provided on the upper portion of the vehicle body 501 is converted by the power converter 503 and is charged in the storage battery 504 or consumed by a load such as the motor 505. The vehicle 500 can be moved by rotating the tires (wheels) 506 by the motor 505 using the electric power supplied from the solar cell module 502 or the storage battery 504. The solar cell module 502 may not be a multi-junction type but may be configured only of the first solar cell module including the solar cell 100 according to the first embodiment. In the case of adopting a transparent solar cell module 502, it is also preferable to use the solar cell module 502 as a window for generating electric power on the side surface of the vehicle body 501 in addition to the upper portion of the vehicle body 501.

Hereinafter, the present disclosure will be described more specifically based on Examples, but the present disclosure is not limited to the following Examples.

Example 1

In Example 1, a white glass substrate is used as the substrate, and a transparent conductive film containing Sb-doped $SnO_2$ is used as the first electrode on the back surface side. The substrate is heated at 450° C. in a mixed gas atmosphere of oxygen and argon gas to form a cuprous oxide compound on the first electrode as a photoelectric conversion layer by a sputtering method. Incidentally, Mn is added at the final stage of the formation of the cuprous oxide compound layer. Subsequently, a metal oxide layer containing Zn and Ge is deposited on the photoelectric conversion layer as an n-type layer by an atomic layer deposition method, and Zn and Ge are diffused into the photoelectric conversion layer to form a mixed region which has a thickness of about 5 nm and contains Zn (first group), Mn (second group), and Ge (third group).

Subsequently, an AZO transparent conductive film is deposited on the surface side as a second electrode. $MgF_2$ is deposited on the film as an antireflective film, thereby obtaining a solar cell.

A solar simulator which simulates a light source with AM 1.5 G is used, and the light amount is adjusted to 1 sun under the light source using a reference Si cell. The temperature is 25° C. The voltage is swept, and the current density (current divided by cell area) is measured. When the horizontal axis represents the voltage and the vertical axis represents the current density, a point intersecting the horizontal axis is the open circuit voltage Voc and a point intersecting the vertical axis is the short-circuit current density Jsc. When the voltage and current density are multiplied on the measurement curve and the maximum points are taken as Vmpp and Jmpp (maximum power point), respectively, FF=(Vmpp*Jmpp)/(Voc*Jsc) and efficiency Eff.=Voc*Jsc*FF are determined.

The cross section of the solar cell obtained is observed by TEM-EDX to determine the concentration of each element.

Example 2

A solar cell is fabricated and evaluated in the same manner as in Example 1 except that a metal oxide layer containing Zn, Sn, and Ge is deposited on the photoelectric conversion layer as an n-type layer and Zn, Sn, and Ge are diffused into the photoelectric conversion layer to form a mixed region which has a thickness of about 5 nm and contains Zn and Sn (first group), Mn (second group), and Ge (third group).

Example 3

A solar cell is fabricated and evaluated in the same manner as in Example 1 except that a metal oxide layer containing Sn and Ge is deposited on the photoelectric conversion layer as an n-type layer and Sn and Ge are diffused into the photoelectric conversion layer to form a mixed region which has a thickness of about 5 nm and contains Sn (first group), Mn (second group), and Ge (third group).

Example 4

A solar cell is fabricated and evaluated in the same manner as in Example 1 except that Nb is added at the final stage of the formation of the cuprous oxide compound layer and a mixed region is formed which has a thickness of about 5 nm and contains Zn (first group), Nb (second group), and Ge (third group).

Example 5

A solar cell is fabricated and evaluated in the same manner as in Example 1 except that Zr is added at the final stage of the formation of the cuprous oxide compound layer and a mixed region is formed which has a thickness of about 5 nm and contains Zn (first group), Zr (second group), and Ge (third group).

Example 6

A solar cell is fabricated and evaluated in the same manner as in Example 1 except that Mo is added at the final stage of the formation of the cuprous oxide compound layer and a mixed region is formed which has a thickness of about 5 nm and contains Zn (first group), Mo (second group), and Ge (third group).

Example 7

A solar cell is fabricated and evaluated in the same manner as in Example 1 except that Cr is added at the final stage of the formation of the cuprous oxide compound layer and a mixed region is formed which has a thickness of about 5 nm and contains Zn (first group), Cr (second group), and Ge (third group).

Example 8

A solar cell is fabricated and evaluated in the same manner as in Example 1 except that Cl is added at the final stage of the formation of the cuprous oxide compound layer and a mixed region is formed which has a thickness of about 5 nm and contains Zn (first group), Cl (second group), and Ge (third group).

Example 9

A solar cell is fabricated and evaluated in the same manner as in Example 1 except that I is added at the final stage of the formation of the cuprous oxide compound layer and a mixed region is formed which has a thickness of about 5 nm and contains Zn (first group), I (second group), and Ge (third group).

Example 10

A solar cell is fabricated and evaluated in the same manner as in Example 1 except that Fe is added at the final stage of the formation of the cuprous oxide compound layer and a mixed region is formed which has a thickness of about 5 nm and contains Zn (first group), Fe (second group), and Ge (third group).

Example 11

A solar cell is fabricated and evaluated in the same manner as in Example 1 except that Ni is added at the final stage of the formation of the cuprous oxide compound layer and a mixed region is formed which has a thickness of about 5 nm and contains Zn (first group), Ni (second group), and Ge (third group).

Example 12

A solar cell is fabricated and evaluated in the same manner as in Example 1 except that Al is added at the final stage of the formation of the cuprous oxide compound layer and a mixed region is formed which has a thickness of about 5 nm and contains Zn (first group), Al (second group), and Ge (third group).

Example 13

A solar cell is fabricated and evaluated in the same manner as in Example 1 except that Ga is added at the final stage of the formation of the cuprous oxide compound layer and a mixed region is formed which has a thickness of about 5 nm and contains Zn (first group), Ga (second group), and Ge (third group).

Example 14

A solar cell is fabricated and evaluated in the same manner as in Example 1 except that Y is added at the final stage of the formation of the cuprous oxide compound layer and a mixed region is formed which has a thickness of about 5 nm and contains Zn (first group), Y (second group), and Ge (third group).

Example 15

A solar cell is fabricated and evaluated in the same manner as in Example 1 except that Sc is added at the final stage of the formation of the cuprous oxide compound layer and a mixed region is formed which has a thickness of about 5 nm and contains Zn (first group), Sc (second group), and Ge (third group).

Example 16

A solar cell is fabricated and evaluated in the same manner as in Example 1 except that V is added at the final stage of the formation of the cuprous oxide compound layer and a mixed region is formed which has a thickness of about 5 nm and contains Zn (first group), V (second group), and Ge (third group).

Example 17

A solar cell is fabricated and evaluated in the same manner as in Example 1 except that F is added at the final stage of the formation of the cuprous oxide compound layer and a mixed region is formed which has a thickness of about 5 nm and contains Zn (first group), F (second group), and Ge (third group).

Example 18

A solar cell is fabricated and evaluated in the same manner as in Example 1 except that Br is added at the final stage of the formation of the cuprous oxide compound layer and a mixed region is formed which has a thickness of about 5 nm and contains Zn (first group), Br (second group), and Ge (third group).

Example 19

A solar cell is fabricated and evaluated in the same manner as in Example 1 except that B is added at the final stage of the formation of the cuprous oxide compound layer and a mixed region is formed which has a thickness of about 5 nm and contains Zn (first group), B (second group), and Ge (third group).

Example 20

A solar cell is fabricated and evaluated in the same manner as in Example 1 except that a metal oxide layer containing Zn and Si is deposited on the photoelectric conversion layer as an n-type layer and Zn and Si are diffused into the photoelectric conversion layer to form a mixed region which has a thickness of about 5 nm and contains Zn (first group), Mn (second group), and Si (third group).

Example 21

A solar cell is fabricated and evaluated in the same manner as in Example 4 except that a metal oxide layer containing Zn and Si is deposited on the photoelectric conversion layer as an n-type layer and Zn and Si are diffused into the photoelectric conversion layer to form a mixed region which has a thickness of about 5 nm and contains Zn (first group), Nb (second group), and Si (third group).

Example 22

A solar cell is fabricated and evaluated in the same manner as in Example 5 except that a metal oxide layer containing Zn and Si is deposited on the photoelectric conversion layer as an n-type layer and Zn and Si are diffused into the photoelectric conversion layer to form a mixed region which has a thickness of about 5 nm and contains Zn (first group), Zr (second group), and Si (third group).

Example 23

A solar cell is fabricated and evaluated in the same manner as in Example 1 except that Zn and Mn are added at the final stage of the formation of the cuprous oxide compound layer and a mixed region is formed which has a thickness of about 5 nm and contains Zn (first group), Mn (second group), and Ge (third group).

Example 24

A solar cell is fabricated and evaluated in the same manner as in Example 1 except that Mn and Ge are added at the final stage of the formation of the cuprous oxide compound layer and a mixed region is formed which has a thickness of about 5 nm and contains Zn (first group), Mn (second group), and Ge (third group).

Example 25

A solar cell is fabricated and evaluated in the same manner as in Example 1 except that Zn, Mn, and Ge are added at the final stage of the formation of the cuprous oxide compound layer and a mixed region is formed which has a thickness of about 5 nm and contains Zn (first group), Mn (second group), and Ge (third group).

Example 26

A solar cell is fabricated and evaluated in the same manner as in Example 1 except that the timing of Mn addition at the final stage of the formation of the cuprous oxide compound layer and the diffusion conditions are changed so that the thickness of the mixed region becomes 1 nm.

Example 27

A solar cell is fabricated and evaluated in the same manner as in Example 1 except that the timing of Mn addition at the final stage of the formation of the cuprous oxide compound layer and the diffusion conditions are changed so that the thickness of the mixed region becomes 10 nm.

Example 28

A solar cell is fabricated and evaluated in the same manner as in Example 1 except that the timing of Mn addition at the final stage of the formation of the cuprous oxide compound layer and the diffusion conditions are changed so that the thickness of the mixed region becomes 20 nm.

Example 29

A solar cell is fabricated and evaluated in the same manner as in Example 1 except that a mixed layer which has a thickness of 5 nm and contains Cu as a main component and to which small amounts of Zn, Mn, and Ge have been added is formed on the cuprous oxide compound layer to which Mn has been added at the final stage and Zn and Ge are diffused from the mixed layer and the n-type layer to form a photoelectric conversion layer including a mixed region (containing Zn (first group), Mn (second group), and Ge (third group)) and a mixed layer (containing Zn (first group), Mn (second group), and Ge (third group)).

Example 30

A solar cell is fabricated and evaluated in the same manner as in Example 1 except that a cuprous oxide compound layer is formed without adding Mn at the final stage, a mixed layer which has a thickness of 5 nm and contains Cu as a main component and to which small amounts of Zn, Mn, and Ge have been added is formed on the cuprous oxide compound layer, and a photoelectric conversion layer is formed which does not include a mixed region but includes a mixed layer (containing Zn (first group), Mn (second group), and Ge (third group)).

Example 31

A solar cell is fabricated and evaluated in the same manner as in Example 1 except that a metal oxide layer containing Zn, Sn, and Si is deposited on the photoelectric conversion layer as an n-type layer and Zn, Sn, and Si are diffused into the photoelectric conversion layer to form a mixed region which has a thickness of about 5 nm and contains Zn and Sn (first group), Mn (second group), and Si (third group).

Example 32

A solar cell is fabricated and evaluated in the same manner as in Example 1 except that a metal oxide layer containing Sn and Si is deposited on the photoelectric conversion layer as an n-type layer and Sn and Si are diffused into the photoelectric conversion layer to form a mixed region which has a thickness of about 5 nm and contains Sn (first group), Mn (second group), and Si (third group).

Example 33

A solar cell is fabricated and evaluated in the same manner as in Example 1 except that a metal oxide layer containing Sn, Ge, and Si is deposited on the photoelectric conversion layer as an n-type layer and Sn, Ge, and Si are diffused into the photoelectric conversion layer to form a mixed region which has a thickness of about 5 nm and contains Sn (first group), Mn (second group), and Ge and Si (third group).

Example 34

A solar cell is fabricated and evaluated in the same manner as in Example 1 except that a metal oxide layer containing Zn, Sn, Ge, and Si is deposited on the photoelectric conversion layer as an n-type layer and Zn, Sn, Ge, and Si are diffused into the photoelectric conversion layer to form a mixed region which has a thickness of about 5 nm and contains Zn and Sn (first group), Mn (second group), and Ge and Si (third group).

Comparative Example 1

A solar cell is fabricated and evaluated in the same manner as in Example 1 except that a cuprous oxide compound layer is formed without adding Mn at the final stage and Zn and Ge are diffused into the photoelectric conversion layer to form a mixed region (not containing elements belonging to the second group) which has a thickness of about 5 nm and contains Zn (first group) and Ge (third group).

Comparative Example 2

A solar cell is fabricated and evaluated in the same manner as in Example 1 except that a mixed layer which has a thickness of 5 nm and contains Cu as a main component and to which small amounts of Zn and Mn have been added is formed on the cuprous oxide compound layer to which Mn has been added at the final stage, ZnO as a metal oxide layer is deposited on the photoelectric conversion layer as an n-type layer, and Zn is diffused into the photoelectric conversion layer to form a mixed region (not containing elements belonging to the third group) which has a thickness of about 5 nm and contains Zn (first group) and Mn (second group).

Comparative Example 3

A solar cell is fabricated and evaluated in the same manner as in Example 1 except that a mixed layer which has a thickness of 5 nm and contains Cu as a main component and to which a small amount of Zn has been added is formed on the cuprous oxide compound layer formed without adding Mn at the final stage, ZnO as a metal oxide layer is deposited on the photoelectric conversion layer as an n-type layer, and Zn is diffused into the photoelectric conversion layer to form a mixed region (not containing elements belonging to the second and third groups) which has a thickness of about 5 nm and contains Zn (first group).

Comparative Example 4

A solar cell is fabricated and evaluated in the same manner as in Example 1 except that GeO as a metal oxide layer is deposited on the photoelectric conversion layer as an n-type layer and Ge is diffused into the photoelectric conversion layer to form a mixed region (not containing elements belonging to the first group) which has a thickness of about 5 nm and contains Mn (second group) and
Ge (third group).

Comparative Example 5

A solar cell is fabricated and evaluated in the same manner as in Example 1 except that a titanium oxide layer is deposited on the photoelectric conversion layer as an n-type layer and a mixed region (not containing elements belonging to the first and third groups) is formed which has a thickness of about 5 nm and contains Mn (second group.

Comparative Example 6

A solar cell is fabricated and evaluated in the same manner as in Example 1 except that a cuprous oxide compound layer is formed without adding Mn at the final stage, GeO is deposited as a metal oxide layer, and Ge is diffused into the photoelectric conversion layer to form a mixed region (not containing elements belonging to the first and second groups) which has a thickness of about 5 nm and contains Ge (third group).

Comparative Example 7

A solar cell is fabricated and evaluated in the same manner as in Example 1 except that a mixed layer which has a thickness of 5 nm and contains Cu as a main component and to which small amounts of Zn and Ge have been added is formed on the cuprous oxide compound layer formed without adding Mn at the final stage, a metal oxide layer containing Zn and Ge is deposited on the photoelectric conversion layer as an n-type layer, and a mixed region (not containing elements belonging to the second group) is formed which has a thickness of about 5 nm and contains Zn (first group) and Ge (third group) without diffusing Zn and Ge into the photoelectric conversion layer.

Comparative Example 8

A solar cell is fabricated and evaluated in the same manner as in Example 1 except that a metal oxide layer containing Mg and Ge is deposited on the photoelectric conversion layer as an n-type layer and Mg and Ge are diffused into the photoelectric conversion layer to form a mixed region (not containing elements belonging to the first group) which has a thickness of about 5 nm and contains Mg (not belonging to any group), Mn (second group), and Ge (third group).

Comparative Example 9

A solar cell is fabricated and evaluated in the same manner as in Example 1 except that a metal oxide layer containing Zn and Sb is deposited on the photoelectric conversion layer as an n-type layer and Zn and Sb are diffused into the photoelectric conversion layer to form a mixed region (not containing elements belonging to the third group) which has a thickness of about 5 nm and contains Zn (first group), Mn (second group), and Sb (not belonging to any group).

Comparative Example 10

A solar cell is fabricated and evaluated in the same manner as in Example 1 except that W is added at the final stage of the formation of the cuprous oxide compound layer and a mixed region (not containing elements belonging to the second group) is formed which has a thickness of about 5 nm and contains Zn (first group), Ge (third group), and W (not belonging to any group).

The results for Examples and Comparative Examples are presented in Table 1. $a+b>c$ is evaluated as A when $a+b>c$, which is the relation between the concentrations a and b and the concentration c, is satisfied, and $a+b>c$ is evaluated as B when $c<a+b<100c$ is satisfied. $c/a$ is evaluated as A when $c/a<1$, which is the relation between the concentration a and the concentration c, is satisfied, and $c/a$ is evaluated as B when $0.01<c/a<1$ is satisfied. It is evaluated as A in a case where FF and Voc are improved as compared with Comparative Examples in which only one kind or two kinds among the first to third groups are contained in the mixed region $2a$ or the mixed layer $2b$, and it is evaluated as B in a case where FF and Voc are equal to or less than those in Comparative Examples.

TABLE 1A

| | $a + b > c$ |
|---|---|
| Example 1 | A |
| Example 2 | B |
| Example 3 | B |
| Example 4 | B |
| Example 5 | A |
| Example 6 | B |
| Example 7 | A |
| Example 8 | A |
| Example 9 | B |
| Example 10 | A |
| Example 11 | A |
| Example 12 | B |
| Example 13 | B |
| Example 14 | A |
| Example 15 | A |
| Example 16 | A |
| Example 17 | B |
| Example 18 | A |
| Example 19 | A |
| Example 20 | B |
| Example 21 | A |
| Example 22 | A |
| Example 23 | A |
| Example 24 | A |
| Example 25 | A |
| Example 26 | B |
| Example 27 | A |
| Example 28 | A |
| Example 29 | B |
| Example 30 | A |
| Example 31 | A |
| Example 32 | A |
| Example 33 | B |
| Example 34 | A |
| Comparative Example 1 | Not containing second group |
| Comparative Example 2 | Not containing third group |
| Comparative Example 3 | Not containing second and third groups |
| Comparative Example 4 | Not containing first group |
| Comparative Example 5 | Not containing first and third groups |
| Comparative Example 6 | Not containing first and second groups |
| Comparative Example 7 | Not containing second group |
| Comparative Example 8 | Not containing first group |
| Comparative Example 9 | Not containing third group |
| Comparative Example 10 | Not containing second group |

TABLE 1B

| | c/a | Voc | FF |
|---|---|---|---|
| Example 1 | A | A | A |
| Example 2 | B | A | A |
| Example 3 | B | A | A |
| Example 4 | B | A | A |
| Example 5 | B | A | A |
| Example 6 | B | A | A |
| Example 7 | A | A | A |
| Example 8 | B | A | A |
| Example 9 | B | A | A |
| Example 10 | B | A | A |
| Example 11 | A | A | A |
| Example 12 | A | A | A |
| Example 13 | A | A | A |
| Example 14 | A | A | A |
| Example 15 | B | A | A |
| Example 16 | B | A | A |
| Example 17 | B | A | A |
| Example 18 | A | A | A |
| Example 19 | B | A | A |
| Example 20 | B | A | A |
| Example 21 | A | A | A |
| Example 22 | B | A | A |
| Example 23 | A | A | A |
| Example 24 | A | A | A |
| Example 25 | A | A | A |
| Example 26 | B | A | A |
| Example 27 | A | A | A |
| Example 28 | A | A | A |
| Example 29 | B | A | A |
| Example 30 | B | A | A |
| Example 31 | A | A | A |
| Example 32 | B | A | A |
| Example 33 | A | A | A |
| Example 34 | A | A | A |
| Comparative Example 1 | A | B | B |
| Comparative Example 2 | Not containing third group | B | B |
| Comparative Example 3 | Not containing second and third groups | B | B |
| Comparative Example 4 | Not containing first group | B | B |
| Comparative Example 5 | Not containing first and third groups | B | B |
| Comparative Example 6 | Not containing first and second groups | B | B |
| Comparative Example 7 | A | B | B |
| Comparative Example 8 | Not containing first group | B | B |
| Comparative Example 9 | Not containing third group | B | B |
| Comparative Example 10 | B | B | B |

The solar cells of Examples have all been improved in Voc and FF only in a case where the elements belonging to the three groups are added to the mixed region 2a or the mixed layer 2b, and the efficiency of the solar cells of Examples have also been improved. This is because recombination of photogenerated carriers in the pn junction region including the mixed region 2a or the mixed layer 2b and a decrease in voltage have been improved. It is considered that the elements belonging to the three groups are added at proper concentrations and the resistance value is optimized. As presented in Examples above, a highly efficient solar cell including a cuprous oxide solar cell can be realized by adding proper elements to the mixed region 2a or the mixed layer 2b.

In all Examples, the concentration a which is the average concentration of the elements belonging to the first group and the concentration d which is the average concentration of copper element satisfy $0.000001 < a/d < 0.1$, the concentration b which is the average concentrations of the elements belonging to the second group and the concentration d satisfy $0.0000001 < b/d < 0.1$, and the concentration c which is the average concentration of the elements belonging to the third group and the concentration d satisfy $0.000001 < c/d < 0.001$.

In the specification, some elements are represented only by chemical symbols for elements.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solar cell comprising:
   a transparent first electrode;
   a photoelectric conversion layer mainly containing cuprous oxide on the first electrode;
   an n-type layer on the photoelectric conversion layer; and
   a transparent second electrode on the n-type layer, wherein
   a mixed region or a mixed layer is present on an n-type layer side of the photoelectric conversion layer,
   the mixed region or the mixed layer consisting of contain elements belonging to a first group, a second group, and a third group,
   the first group is one or more elements selected from the group consisting of Zn and Sn,
   the second group is one or more elements selected from the group consisting of Y, Sc, V, Cr, Mn, Fe, Ni, Zr, B, Al, Ga, Nb, Mo, Ti, F, Cl, Br, and I, and
   the third group is one or more elements selected from the group consisting of Ge and Si.

2. The solar cell according to claim 1, wherein a concentration a, a concentration b, and a concentration c satisfy a+b>c, where
   the concentration a denotes an average concentration of elements belonging to the first group in the mixed region or the mixed layer,
   the concentration b denotes an average concentration of elements belonging to the second group in the mixed region or the mixed layer, and
   the concentration c denotes an average concentration of elements belonging to the third group in the mixed region or the mixed layer.

3. The solar cell according to claim 1, wherein a concentration a and a concentration c satisfy c<a, where
   the concentration a denotes an average concentration of elements belonging to the first group in the mixed region or the mixed layer, and
   the concentration c denotes an average concentration of elements belonging to the third group in the mixed region or the mixed layer.

4. The solar cell according to claim 1, wherein the n-type layer is a metal oxide layer containing at least either of Zn or Sn and at least either of Ge or Si.

5. The solar cell according to claim 1, wherein an average concentration of elements belonging to the first group, second group, and third group contained in the photoelectric conversion layer on a first electrode side is lower than a concentration a, a concentration b, and a concentration c, where the concentration a denotes an average concentration of elements belonging to the first group in the mixed region or the mixed layer, the concentration b denotes an average concentration of elements belonging to the second group in the mixed region or the mixed layer, and the concentration c denotes an average concentration of elements belonging to the third group in the mixed region or the mixed layer.

6. The solar cell according to claim 1, wherein a concentration a and a concentration c satisfy c<a<100c, where the concentration a denotes an average concentration of elements belonging to the first group in the mixed region or the mixed layer, and the concentration c denotes an average concentration of elements belonging to the third group in the mixed region or the mixed layer.

7. The solar cell according to claim 1, wherein a concentration a, a concentration b, and a concentration c satisfy c<a+b<100c, where the concentration a denotes an average concentration of elements belonging to the first group in the mixed region or the mixed layer, the concentration b denotes an average concentration of elements belonging to the second group in the mixed region or the mixed layer, and the concentration c denotes an average concentration of elements belonging to the third group in the mixed region or the mixed layer.

8. The solar cell according to claim 1, wherein
a thickness of the mixed region is 1 nm or more and 20 nm or less, and
a thickness of the mixed layer is 1 nm or more and 20 nm or less.

9. The solar cell according to claim 1, wherein 90 wt % or more of the photoelectric conversion layer is cuprous oxide.

10. A multi-junction solar cell comprising the solar cell according to claim 1.

11. A solar cell module comprising the solar cell according to claim 1.

12. A solar photovoltaic power generation system comprising the solar cell module according to claim 11 to generate electric power.

* * * * *